(12) United States Patent
Chen

(10) Patent No.: US 10,795,268 B2
(45) Date of Patent: Oct. 6, 2020

(54) METHOD AND APPARATUS FOR MEASURING OVERLAY ERRORS USING OVERLAY MEASUREMENT PATTERNS

(71) Applicant: TAIWAN SEMICONDUCTOR MANUFACTURING CO., LTD., Hsinchu (TW)

(72) Inventor: Yen-Liang Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 15/721,064

(22) Filed: Sep. 29, 2017

(65) Prior Publication Data
US 2019/0101835 A1    Apr. 4, 2019

(51) Int. Cl.
| | | |
|---|---|---|
| *G03F 7/20* | (2006.01) | |
| *G01B 11/27* | (2006.01) | |
| *G03F 9/00* | (2006.01) | |

(52) U.S. Cl.
CPC ........ *G03F 7/70633* (2013.01); *G01B 11/272* (2013.01); *G03F 7/70683* (2013.01); *G03F 9/7076* (2013.01)

(58) Field of Classification Search
CPC ....... H01L 23/544; H01L 22/00; H01L 22/20; H01L 2223/54426; G03F 7/70633; G03F 7/70625; G03F 9/7076; G03F 9/7073; G03F 7/70683; G01B 11/272
See application file for complete search history.

(56) References Cited

U.S. PATENT DOCUMENTS

| | | | | |
|---|---|---|---|---|
| 6,573,975 B2* | 6/2003 | Govil | ................. | G03F 7/70066 355/52 |
| 6,982,793 B1* | 1/2006 | Yang | ................... | G03F 7/70633 356/401 |
| 2003/0021467 A1* | 1/2003 | Adel | .................... | G03F 7/70633 382/151 |
| 2003/0160163 A1* | 8/2003 | Wong | .................... | G02B 27/46 250/237 R |
| 2004/0246482 A1* | 12/2004 | Sezginer | ............ | G01N 21/4788 356/401 |
| 2007/0291269 A1* | 12/2007 | Van Der Schaar | .......................... | G03F 7/70633 356/401 |
| 2013/0258310 A1 | 10/2013 | Smilde et al. | | |
| 2016/0161864 A1 | 6/2016 | Middlebrooks et al. | | |

FOREIGN PATENT DOCUMENTS

TW           200538703 A      12/2005

* cited by examiner

*Primary Examiner* — Michael P LaPage
(74) *Attorney, Agent, or Firm* — McDermott Will & Emery LLP

(57) ABSTRACT

An overlay error measurement structure includes a lower-layer pattern disposed over a substrate, and an upper-layer pattern disposed over the lower-layer pattern and at least partially overlapping with the lower-layer pattern. The lower-layer pattern includes a plurality of first sub-patterns extending in a first direction and being arranged in a second direction crossing the first direction. The upper-layer pattern includes a plurality of second sub-patterns extending in the first direction and being arranged in the second direction. At least one of a pattern pitch and a pattern width of at least one of at least a part of the first sub-patterns and at least a part of the second sub-patterns varies along the second direction.

20 Claims, 7 Drawing Sheets

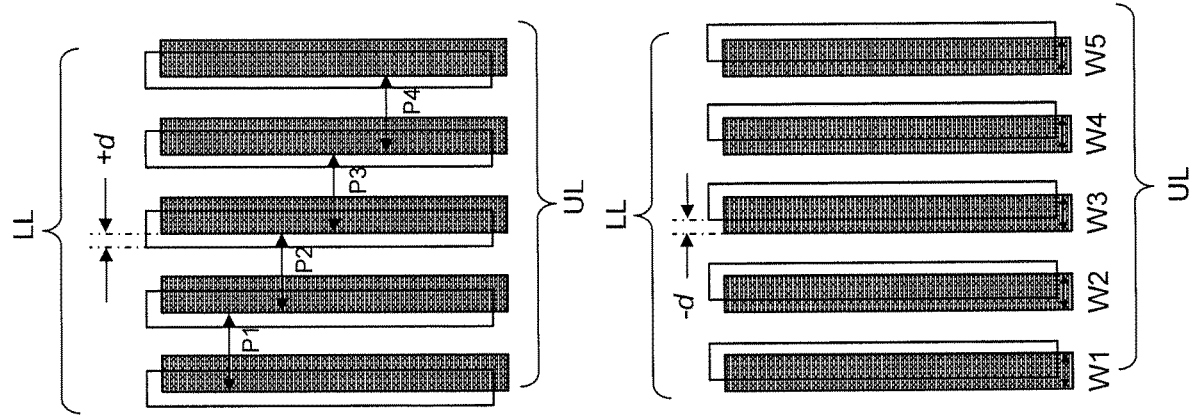
FIG. 1B
FIG. 1C
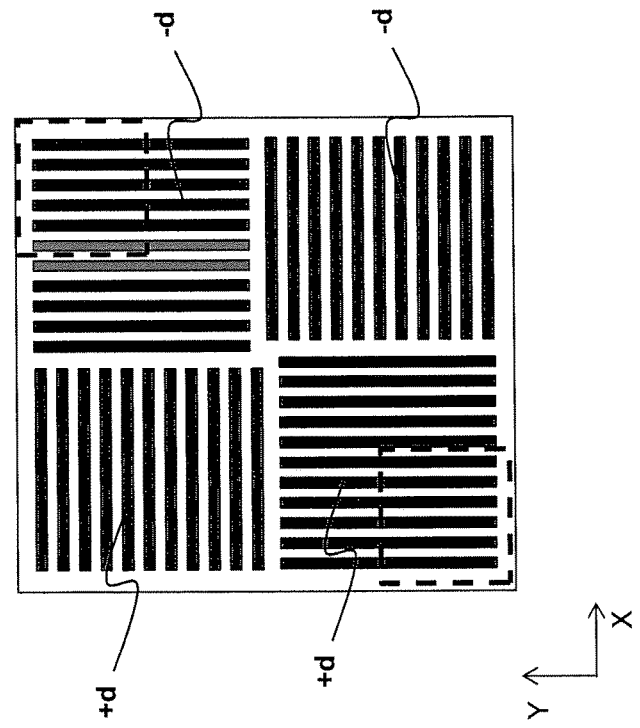
FIG. 1A

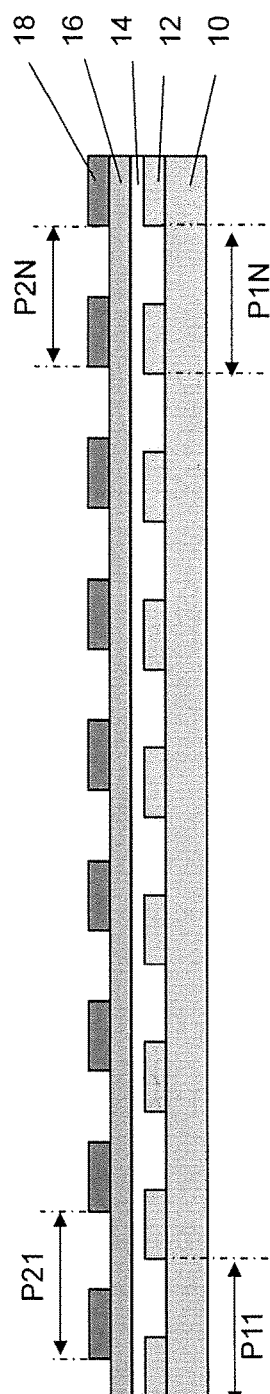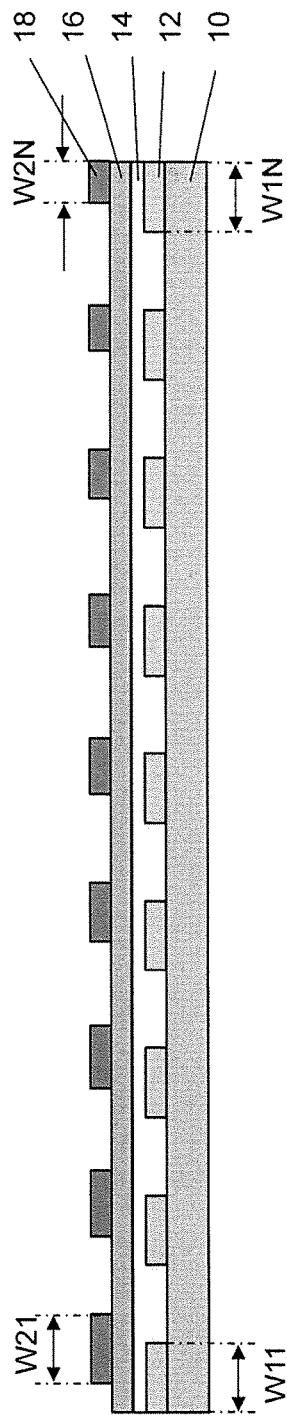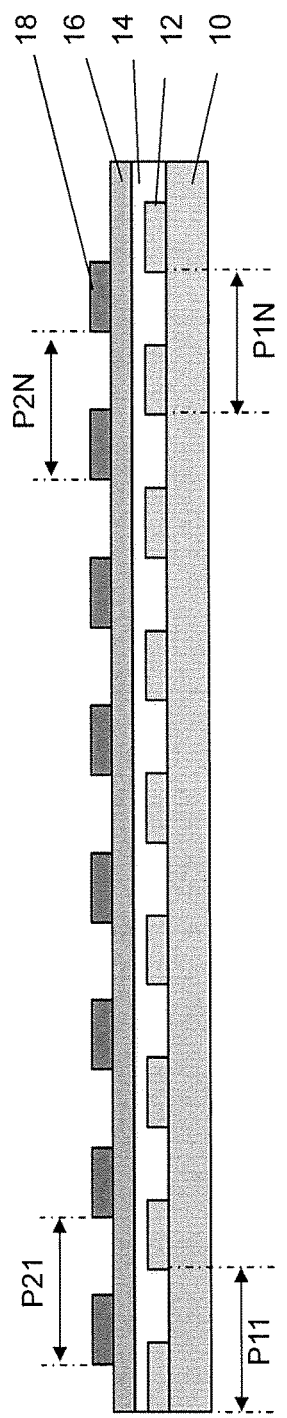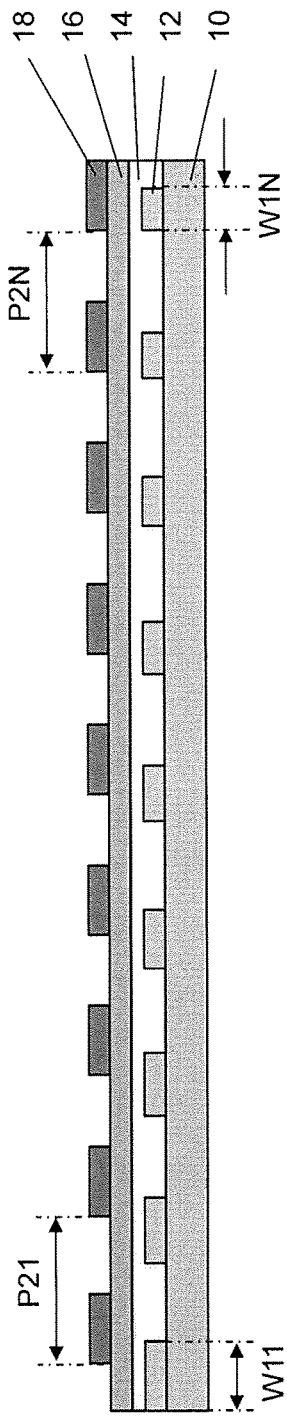

METHOD AND APPARATUS FOR MEASURING OVERLAY ERRORS USING OVERLAY MEASUREMENT PATTERNS

TECHNICAL FIELD

The disclosure relates to overlay measurement structures used in semiconductor device manufacturing operations, and methods of measuring overlay errors.

BACKGROUND

As the semiconductor industry has progressed into nanometer technology process nodes in pursuit of higher device density, reducing overlay errors of a photo resist pattern and an underlying pattern in a lithography operation has become one of the important issues. In particular, correctly measuring overlay errors has become more and more difficult because of various factors, such as asymmetric shapes of measurement structures. Thus, overlay measurement patterns and methods which can more precisely measure overlay errors have been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C and 1D show schematic views of overlay measurement patterns in accordance with an embodiment of the present disclosure.

FIGS. 3A, 3B, 3C and 3D show various cross sectional views of overlay measurement patterns according to an embodiment of the present disclosure.

DETAILED DESCRIPTION

Figure 1D:
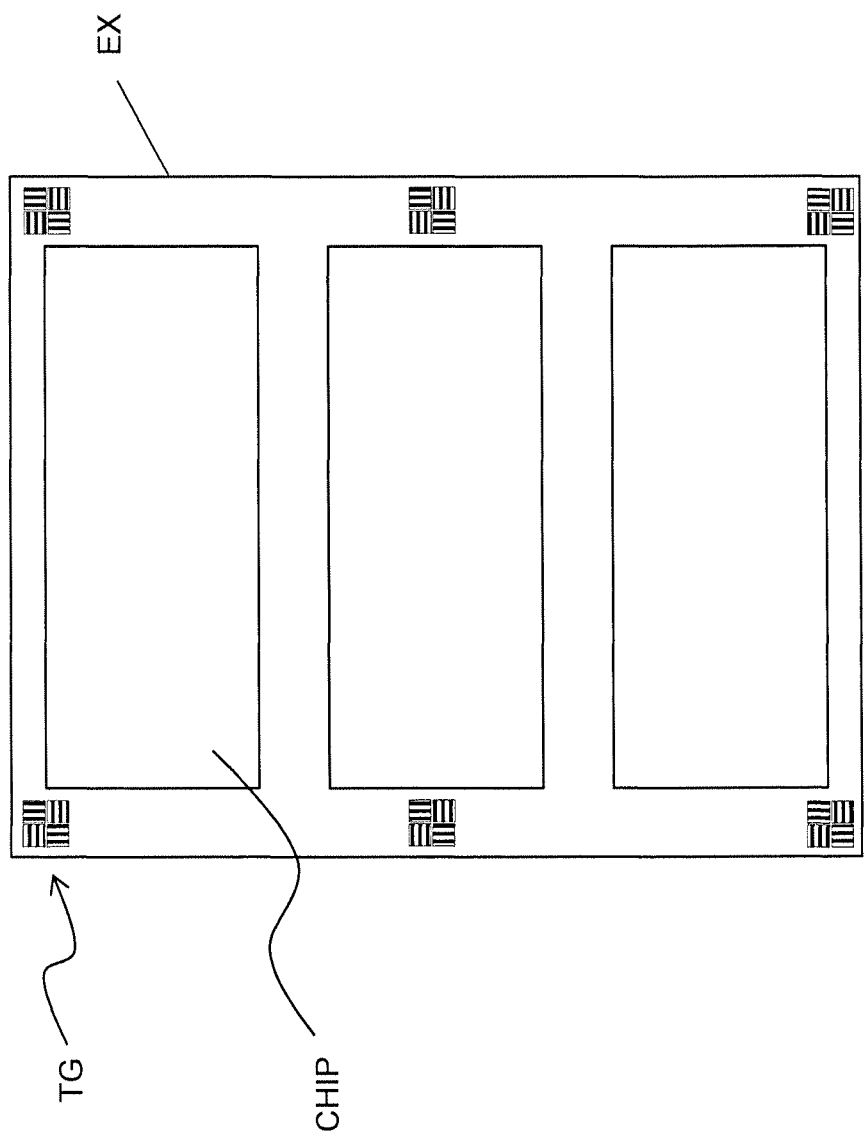

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." The term "at least one of A and B" means "A", "B" or "A and B" and does not mean "one from A and one from B" unless otherwise explained.

In the most recent lithography operations, diffraction based overlay (DBO) measurement structures are used in the overlay measurement. The overlay measurement structure (target) used on DBO measurement includes a periodic pitch grating (line-and-space patterns) with a constant pitch on both the previous layer (underlying layer) and the current layer (patterned resist layer). In the current DBO measurement structures, the underlying patterns are often asymmetric due to various reasons, such as etching operations, internal stress caused by film depositions and/or thermal process, a planarization operation including an etch-back process and a chemical mechanical polishing (CMP) process. When the measurement patterns have such asymmetry, the overlay measurement error increases, because the DBO measurement technique measures the asymmetry between the previous and the current layer and converts the asymmetry into a part of the overlay errors. It has been difficult to decouple measurement errors caused by the pattern asymmetry from the overlay errors measured by using the DBO measurement structure. In the present disclosure, "an overlay error" means a positional error (shift) of the underlying pattern and the current (resist) pattern to be aligned, and "a measurement error" means an error caused in the overlay error measurement due to various factors.

In the present disclosure, a novel overlay measurement structure with a specific calculation method for reducing measurement errors caused by pattern asymmetry will be disclosed.

FIGS. 1A-1C show schematic views of the DBO measurement patterns in accordance with an embodiment of the present disclosure.

One set of a DBO measurement structure has four quadrant areas (target areas), for example, two for the X direction measurement and two for the Y direction measurement. Each target area has a size, for example, 8 µm×8 µm on a substrate. The DBO measurement structures of four quadrant areas are placed on several locations in one exposure area (e.g., one or two chip areas).

The overlay errors are measured as a lateral displacement (X and Y directions) between the previously formed pattern and the currently formed pattern. The currently formed pattern is generally a photo resist pattern. The DBO measurement structure formed by the underlying layer (e.g., polysilicon layer, metal layer, insulating material layer, and/or substrate) is called a lower layer pattern, a previous pattern and/or an underlying pattern. The DBO measurement structure formed by the photo resist pattern formed by a lithography operation is called an upper layer pattern, a current pattern and/or a photo resist pattern.

As set forth above, the conventional DBO measurement structures include grating patterns having line-and-space patterns having the same line width and arranged with a constant pitch in the X direction and the Y direction. The DBO measurement structures include designed pattern shifts between the lower layer and the upper layer. For example, one of the two areas for the X direction measurement of the DBO measurement structures is designed to have a shift "d" in the X direction between the lower layer and the upper layer, and the other of the two target areas for the X direction measurement is designed to have a shift "−d" in the X direction between the lower layer and the upper layer. Similarly, one of the two target areas for the Y direction measurement of the DBO measurement structures is designed to have a shift "d" in the Y direction between the lower layer and the upper layer, and the other of the two areas for the Y direction measurement is designed to have a shift "−d" in the Y direction between the lower layer and the upper layer. As explained in greater detail below, the grating patterns of the DBO measurement structures of the present embodiments are non-uniform, and at least one of a pattern pitch and a pattern width of the DBO measurement structures varies.

As shown in FIG. 1A, one set of the DBO measurement structures TG includes four quadrature targets areas, two of which are for the X direction and two of which are for the Y direction, and each has +d or −d designed shift with respect to the previous (lower) layer to be aligned. As shown in FIG. 1D, the sets of the DBO measurement structures TG including four quadrature targets areas are provided, for example, at four corners of one exposure area EX. In some embodiments, one exposure area includes two or more semiconductor chip patterns CHIP. In other embodiments, additional two or more sets of the DBO measurement structures TG including four quadrature targets areas are provided.

A measurement light is applied to the DBO measurement structures, and ±first order diffraction lights are acquired. The measurement light may have a wavelength in a visible light range, an ultra violet range and a deep ultra violet range. In some embodiments, the light source of the measurement light may be a xenon lamp or a mercury lamp. The light reflected by the DBO measurement structures formed on the substrate is directed to an optical system including various optical elements, such as lenses, and received by a detector. The optical system includes a dark-field-system, which can be realized by inserting an aperture plate of suitable form between lenses (at pupil plane).

When the measurement light is applied to the DBO measurement structures (grating), the reflecting light includes a zero-th order light, two first order lights (+1 and −1) and higher order lights. Since the size (numerical aperture) of the optical system is limited, only the zero-th order and ±1 st order lights enter the optical system. In the optical system, the zero-th order light is blocked by an aperture stop disposed at the pupil plane, and thus the image of the DBO measurement structures is formed only from the −1 or +1 first order lights on the detector, such as an image sensor.

Figure 2B:
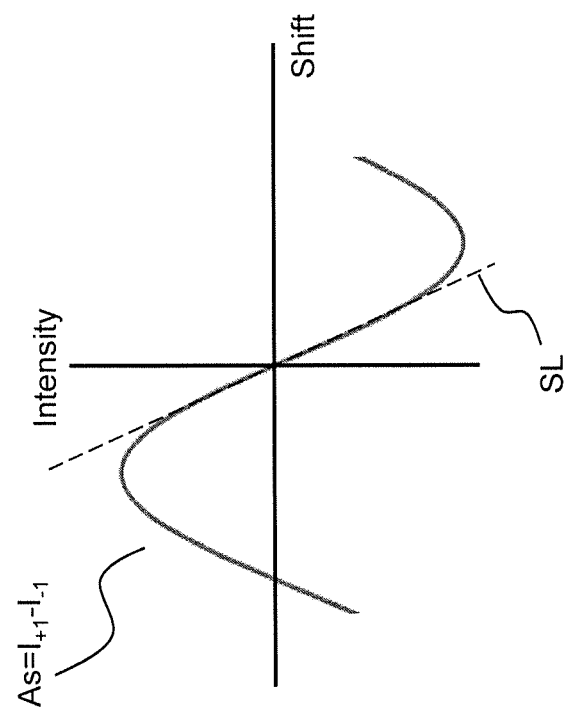
FIGS. 2A and 2B illustrate diffraction patterns of the overlay measurement patterns.
Figure 2A:
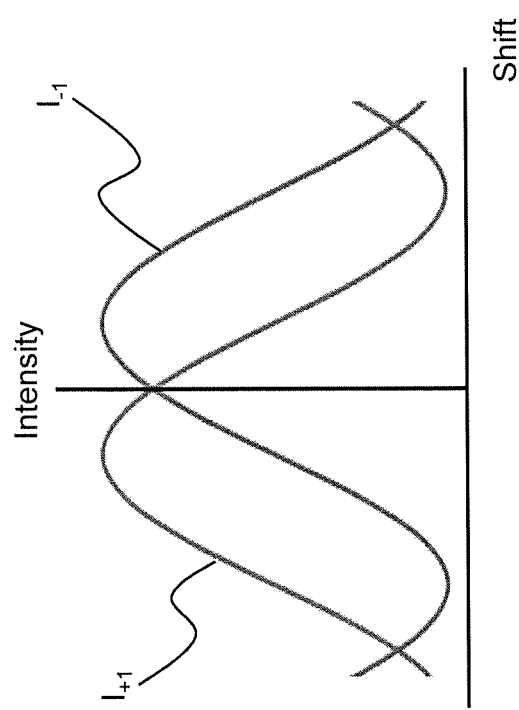

FIG. 2A shows light intensities of the first order diffraction lights $I_{+1}$ and $L_1$ as a function of overlay (shift). If there is no overlay error, the intensities of the ±1$^{st}$ order diffraction lights are the same. Asymmetry function As can be obtained by adding $I_{+1}$ and $L_1$ as shown in FIG. 2B. For the target area with +d shift, the asymmetry function is:

$$As^{(+d)} = k \cdot \sin\left[\frac{2\pi}{P}(ov+d)\right]$$

For the target area with +d shift, the asymmetry function is:

$$As^{(-d)} = k \cdot \sin\left[\frac{2\pi}{P}(ov-d)\right]$$

Here, ov is an overlay error between the lower layer and the upper layer to be measured, P is a pattern (grating) pitch, and k is determined by measurement conditions (e.g., light wavelength), target type, film structures (e.g., thickness, refractive index, absorption coefficient) between the lower layer and the upper layer. Based on the foregoing asymmetry functions $As^{(+d)}$ and $As^{(+d)}$, the overlay error ov can be calculated. When $$\frac{2\pi}{P}(ov \pm d)$$

is sufficiently small, $As^{(+d)}$ can be approximated to $$k\frac{2\pi}{P}(ov+d)$$

and $As^{(-d)}$ can be approximated to $$k\frac{2\pi}{P}(ov-d),$$

which are equal to a slope SL in FIG. 2B, and thus ov can be calculated.

In contrast, in the DBO measurement structure of the present embodiments, at least one of the pattern width and the pattern pitch varies within one target area (i.e., non-uniform).

For example, as shown in FIG. 1B, the upper layer UL at the lower left target pattern is designed to have a shift +d with respect to the lower layer LL similar to the conventional DBO measurement structure, but have non-constant pattern pitches P1, P2, P3, P4 and P5 different from each other. In some embodiments, the pitches satisfy P1<P2<P3<P4<P5, or P1>P2>P3>P4>P5. Of course, it is not necessary that the pitches change sequentially or gradually, and in some embodiments, the pitches are designed to be randomly changed. For the upper right target pattern, the similar patterns with the similar pitch configuration with a shift −d with respect to the lower layer LL may be used.

In other embodiments, as shown in FIG. 1C, the upper layer UL at the upper right target pattern is designed to have a shift −d with respect to the lower layer LL similar to the conventional DBO measurement structure, but have variable pattern width W1, W2, W3, W4 and W5 different from each other. In some embodiments, the widths satisfy W1<W2<W3<W4<W5 or W1>W2>W3>W4>W5. Of course, it is not necessary that the widths change sequentially or gradually, and in some embodiments, the widths are designed to be randomly changed. For the lower left target pattern, the similar patterns with the similar width configuration with a shift +d with respect to the lower layer LL may be used. Although FIGS. 1B and 1C show five line patterns for illustration purpose, the actual DBO measurement structure includes more than five lines. In certain embodiments, the number of lines is in a range from about 10 to about 50.

When the DBO measurement structures include pattern asymmetry, the asymmetric function As can be expressed as follows:

$$As^{(+d)} = k \cdot \sin\left[\frac{2\pi}{P}(ov+d)\right] + \Delta As_1$$

$$As^{(-d)} = k \cdot \sin\left[\frac{2\pi}{P}(ov-d)\right] + \Delta As_2$$

where $\Delta As_1$ and $\Delta As_2$ are asymmetry errors caused by pattern shape of the lower and/or upper DBO measurement structures. From the above equations, the following equations can be obtained.

$$As^{(+d)} - \Delta As_1 = k \cdot \sin\left[\frac{2\pi}{P}(ov+d)\right]$$

$$As^{(-d)} - \Delta As_2 = k \cdot \sin\left[\frac{2\pi}{P}(ov-d)\right]$$

Further, from the above equations, the following equations can be obtained.

$$\frac{As^{(+d)} - \Delta As_1}{As^{(-d)} - \Delta As_2} = \frac{\sin\left[\frac{2\pi}{P}(ov+d)\right]}{\sin\left[\frac{2\pi}{P}(ov-d)\right]} = k_2$$

Further, this equation can be rewritten as follows:

$$As^{(+d)} = k_2 \cdot As^{(-d)} + \Delta As$$

Here, the factor $k_2$ is not related to the measurement condition, target type, and/or film structures between the lower layer and the upper layer.

Thus, when the various measurements results of intensities in asymmetry functions $As^{(+d)}$ and $As^{(-d)}$ for various measurement patterns (with different width, pitch, etc.) are obtained and plotted on an X-Y plane, the result should be linear with the slope $k_2$.

In the present embodiments, the diffraction patterns from the upper and lower DBO measurement structures with four target areas are obtained by an optical image sensor. The optical image sensor includes a plurality of pixels arranged in a matrix. In some embodiments, the number of pixels is 50 or more per the diffraction image, and in certain embodiments, the number of pixels is about 200 to about 400. The diffraction image obtained by the optical image sensor is analyzed pixel-by-pixel basis by using image processing, in some embodiments. For example, asymmetry functions $As^{(+d)}$ and/or $As^{(-d)}$ are obtained by pixel-by-pixel basis, and thus about hundreds of data for the asymmetry functions $As^{(+d)}$ and/or $As^{(-d)}$ can be obtained, and be plotted, as shown in FIG. 2C. By obtaining the linear approximate line, it is possible to obtain $\Delta As$ and the value $k_2$.

Thus, the overlay error ov can be obtained from the following equation:

$$ov_1 = \frac{P}{2\pi}\tan^{-1}\left[\frac{1+k_2}{1-k_2} \cdot \tan\left(\frac{2\pi}{P}d\right)\right]$$

Here, $ov_1$ is an overlay error in the X direction obtained from the DBO measurement patterns extending in the Y direction and arranged in the X direction. Similarly, $ov_2$, which is an overlay error in the Y direction, can be obtained from the DBO measurement patterns extending in the X direction and arranged in the Y direction. In other words, the diffraction images for the X direction and the diffraction images for the Y direction are analyzed, respectively, by the forgoing method, and the overlay errors for the X direction and the Y direction can be obtained independently.

Figure 2D:
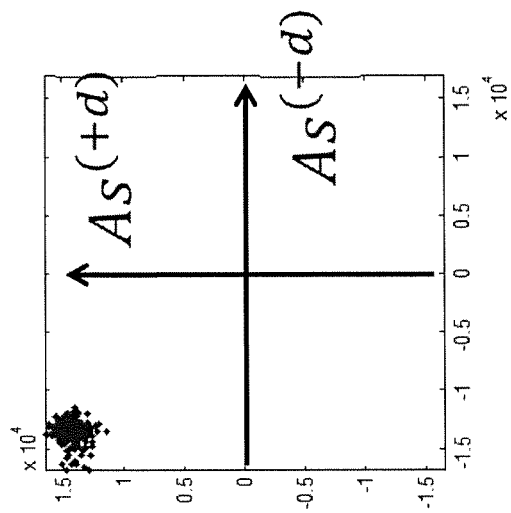
FIG. 2D shows asymmetric functions obtained from diffraction patterns of a comparative example.
Figure 2C:
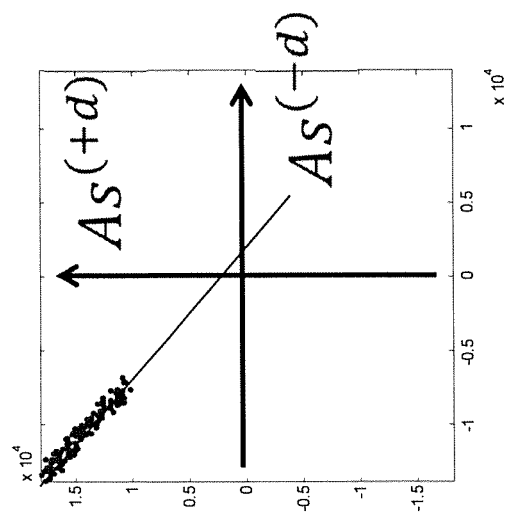
FIG. 2C shows asymmetric functions obtained from diffraction patterns of the overlay measurement patterns in accordance with an embodiment of the present disclosure.

If the DBO measurement structures have a constant width and a constant pitch (i.e., uniform), the measurement results of the asymmetry functions $As^{(+d)}$ and/or $As^{(-d)}$ would be aggregated at one point as shown in FIG. 2D, and it would not be possible to obtain the linear approximation. In contrast, as set forth above, the DBO measurement patterns of the present embodiments utilize non-uniform patterns, the measurement results of the asymmetry functions $As^{(+d)}$ and/or $As^{(-d)}$ spread as shown in FIG. 2C, and thus it is possible to obtain the slope $k_2$ from the plot of FIG. 2C. The plotting of the measurement results of the asymmetry functions $As^{(+d)}$ and/or $As^{(-d)}$ and obtaining the slope $k_2$ can be performed by using a computer executing a program stored in a memory. In some embodiments, such a computer system for calculating the overlay error is provided inside the overlay error measurement apparatus with an optical system, and in other embodiments, the computer system is separately provided from the overlay error measurement apparatus and coupled to the overlay measurement apparatus via a wired or wireless network. Further, the obtained overlay errors are fed-back to a lithography apparatus (scanners and/or steppers) to perform subsequent lithography operations by compensating the overlay errors.

It is noted that when the pattern pitch and/or the pattern width varies, the designed shift amount +d and −d can be determined from the distance between the center of gravity of the upper layer patterns in plan view and the center of gravity of the lower layer patterns in plan view, in some embodiments. In other embodiments, the designed shift amount +d and −d can be a distance between the center pattern of the lower layer patterns and the center pattern of the upper layer patterns.

In some embodiments, the pixel size of the optical image sensor is in a range from 0.1 $\mu m^2$ to about 1.0 $\mu m^2$. In certain embodiments, the pixel size of the optical image sensor is 0.4 $\mu m \times 0.4$ $\mu m$.

In some embodiments, instead of the pixel-by-pixel basis analysis, a group of pixels, for example, four pixels adjacent to each other in the X direction and the Y direction, can be used as an area to be image analyzed. In such a case, the number of the groups of pixels is 50 or more per the diffraction image in some embodiments.

FIGS. 3A-3D show various DBO measurement structures according to embodiments of the present disclosure. FIGS. 3A-3D shows cross sectional views corresponding to one of quadrature targets areas. In FIGS. 3A-3D, the lower layer DBO measurement pattern 12 is formed over a substrate. A first intermediate layer 14 is formed over the lower layer pattern 12 and the second intermediate layer 16 is formed over the first layer 14. The upper layer DBO measurement pattern 18 formed by photo resist is formed on the second layer 14. Although two intermediate layers (the first and second intermediate layers) are disposed between the lower layer DBO measurement pattern 12 and the upper layer DBO measurement pattern 18, the number of intermediate layers is not limited to two. The number can be one or more than two. In FIGS. 3A-3D, there is no overlay error between the lower layer DBO measurement pattern 12 and the upper layer DBO measurement pattern 18.

In some embodiments, the lower layer pattern 12 is made of conductive material, such as poly silicon, and formed by lithography and etching operations. In some embodiments, the lower layer pattern 12 is a poly silicon pattern for a dummy gate electrode for a semiconductor device, which will be replaced with a metal gate. After a blanket layer of poly silicon is formed over the substrate 10, a hard mask layer made of one or more dielectric material layers is formed on the poly silicon layer. In some embodiments, the substrate 10 includes various structures and/or areas, such as isolation insulating regions (i.e., shallow trench isolation (STI)). Then, one or more first lithography operations are performed to form a photo resist pattern. The first lithography operation utilizes a deep ultra violet light source, such as a KrF excimer laser or an ArF excimer layer, or an extreme ultra violet light source. Then, by using the photo resist pattern as an etching mask, the hard mask layer is patterned by dry etching, and then the poly silicon layer is etched by using the patterned hard mask layer as an etching mask. Then, one or more intermediate layers are formed over the patterned poly silicon layer. When the poly silicon pattern for the semiconductor device is formed, the lower layer DBO measurement structures are formed at the same time.

The one or more intermediate layers are made of insulating material, such as silicon oxide or silicon nitride. The one or more intermediate layers can be formed by a suitable film forming method, such as chemical vapor deposition (CVD), atomic layer deposition (ALD) or physical vapor deposition (PVD). After the intermediate layers are formed, a thermal operation, such as rapid thermal annealing, may be performed, in some embodiments. In other embodiments, a planarization operation, such as an etch-back operation or a CMP operation, is performed. After the one or more intermediate layers are formed, a second lithography operation for the next pattern is performed. The second lithography operation is performed to detect alignment marks formed by the poly silicon layer so that the photo resist pattern formed by the second lithography operation accurately aligns to the poly silicon patterns. It is understood that additional operations can be provided before, during, and after processes as set forth above, and some of the operations described above can be replaced or eliminated, for additional embodiments of the method. The order of the operations/processes may be interchangeable.

In FIG. 3A, the lower layer DBO measurement pattern 12 has a constant line width and a constant pitch, i.e., $P11=P12=P13, \ldots =P1N$, when the number of lines is N, while, the upper layer DBO measurement pattern 18 has variable pitches $P21, P22, \ldots, P2N$ different from each other. In some embodiments, the non-uniform pitches $P21$-$P2N$ are in a range from about 400 nm to about 800 nm and are in a range from about 500 nm to about 700 nm in other embodiments. In some embodiments, the non-uniform pitches satisfy $P21>P22> \ldots >P2N$ or $P21<P22< \ldots <P2N$. In other embodiments, a group of patterns has a different pitch from another group of patterns. For example, the pitches may satisfy $P21=P22<P23= \ldots =P2N$. In certain embodiments, a difference in pitch (e.g., $\Delta P=|P21-P22|$) is constant. The center of gravity of the upper layer DBO measurement pattern 18 is designed to be shifted by +d with respect to the center of gravity of the lower layer DBO measurement pattern 12. When the pitch varies, the pitch P in the foregoing asymmetry functions As can be the average of the non-uniform pitches $P21, P22, \ldots$ and $P2N$, or the pitch of patterns corresponding to the area of pixel-by-pixel analysis (e.g., one pixel).

In FIG. 3B, the lower layer DBO measurement pattern 12 has a constant line width and a constant width, i.e., $W11=W12=W13, \ldots =W1N$, while the upper layer DBO measurement pattern 18 has non-uniform widths $W21, W22, \ldots, W2N$ different from each other. In some embodiments, the non-uniform widths satisfy $W21>W22> \ldots >W2N$ or $W21<W22< \ldots <W2N$. In some embodiments, the non-uniform widths $W21$-$W2N$ are in a range from about 200 nm to about 400 nm and are in a range from about 250 nm to about 350 nm in other embodiments. In other embodiments, a group of patterns has a different width from another group of patterns. For example, the widths may satisfy $W21=W22<WP23= \ldots =W2N$. In certain embodiments, a difference in width (e.g., $\Delta W=|W21-W22|$) is constant. The center of gravity of the upper layer DBO measurement pattern 18 is designed to be shifted by +d with respect to the center of gravity of the lower layer DBO measurement pattern 12.

In FIG. 3C, the upper layer DBO measurement pattern 18 has a constant line width and a constant pitch, i.e., $P21=P22=P23, \ldots =P2N$, while, the lower layer DBO measurement pattern 12 has non-uniform pitches $P11, P12, \ldots, P1N$ different from each other. In some embodiments, the non-uniform pitches satisfy $P11>P12> \ldots >P1N$ or $P11<P12< \ldots <P1N$. In other embodiments, a group of patterns has a different pitch from another group of patterns. In certain embodiments, a difference in pitch (e.g., $\Delta P=|P11-P12|$) is constant. In some embodiments, the non-uniform pitches $P11$-$P1N$ are in a range from about 400 nm to about 800 nm and are in a range from about 500 nm to about 700 nm in other embodiments. The center of gravity of the upper layer DBO measurement pattern 18 is designed to be shifted by +d with respect to the center of gravity of the lower layer DBO measurement pattern 12.

In FIG. 3D, the upper layer DBO measurement pattern 18 has a constant line width and a constant width, i.e., $W21=W22=W23, \ldots =W2N$, while the lower layer DBO measurement pattern 12 has non-uniform widths $W11, W12, \ldots, W1N$ different from each other. In some embodiments, the non-uniform widths satisfy $W11>W12> \ldots >W1N$ or $W11<W12< \ldots <W1N$. In other embodiments, a group of patterns has a different width from another group of patterns. In certain embodiments, a difference in width (e.g., $\Delta W=|W11-W12|$) is constant. In some embodiments, the non-uniform widths $W11$-$W1N$ are in a range from about 200 nm to about 400 nm and are in a range from about 250 nm to about 350 nm in other embodiments. The center of gravity of the upper layer DBO measurement pattern 18 is designed to be shifted by +d with respect to the center of gravity of the lower layer DBO measurement pattern 12.

In FIGS. 3A-3D, one of the lower layer DBO measurement pattern 12 and the upper layer DBO measurement pattern 18 has a constant grating structure. In other embodiments, both of the lower layer DBO measurement pattern 12 and the upper layer DBO measurement pattern 18 has variable pitches and/or variable widths. For example, in some embodiments, the lower layer DBO measurement patterns have variable width, and the upper layer DBO measurement patterns have variable pitches, or the lower layer DBO measurement patterns have variable pitches, and the upper layer DBO measurement patterns have variable width. In other embodiments, the lower layer DBO measurement patterns have variable width, and the upper layer DBO measurement patterns also have variable widths, or the lower layer DBO measurement patterns have variable pitches, and the upper layer DBO measurement patterns also have variable pitches.

In FIGS. 1A-1C and 3A-3D, one target area of the quadrant patterns has the same line width in the direction crossing the pattern arrangement direction. For example, as shown in FIGS. 1B and 1C, the line patterns extend in the Y direction substantially from the lower end of the target area to the upper end of the target area having the same line length, while the pitch and/or width of the X direction vary. In other words, within one target area, the patterns are non-uniform in the X direction but uniform in the Y direction.

Figure 4:
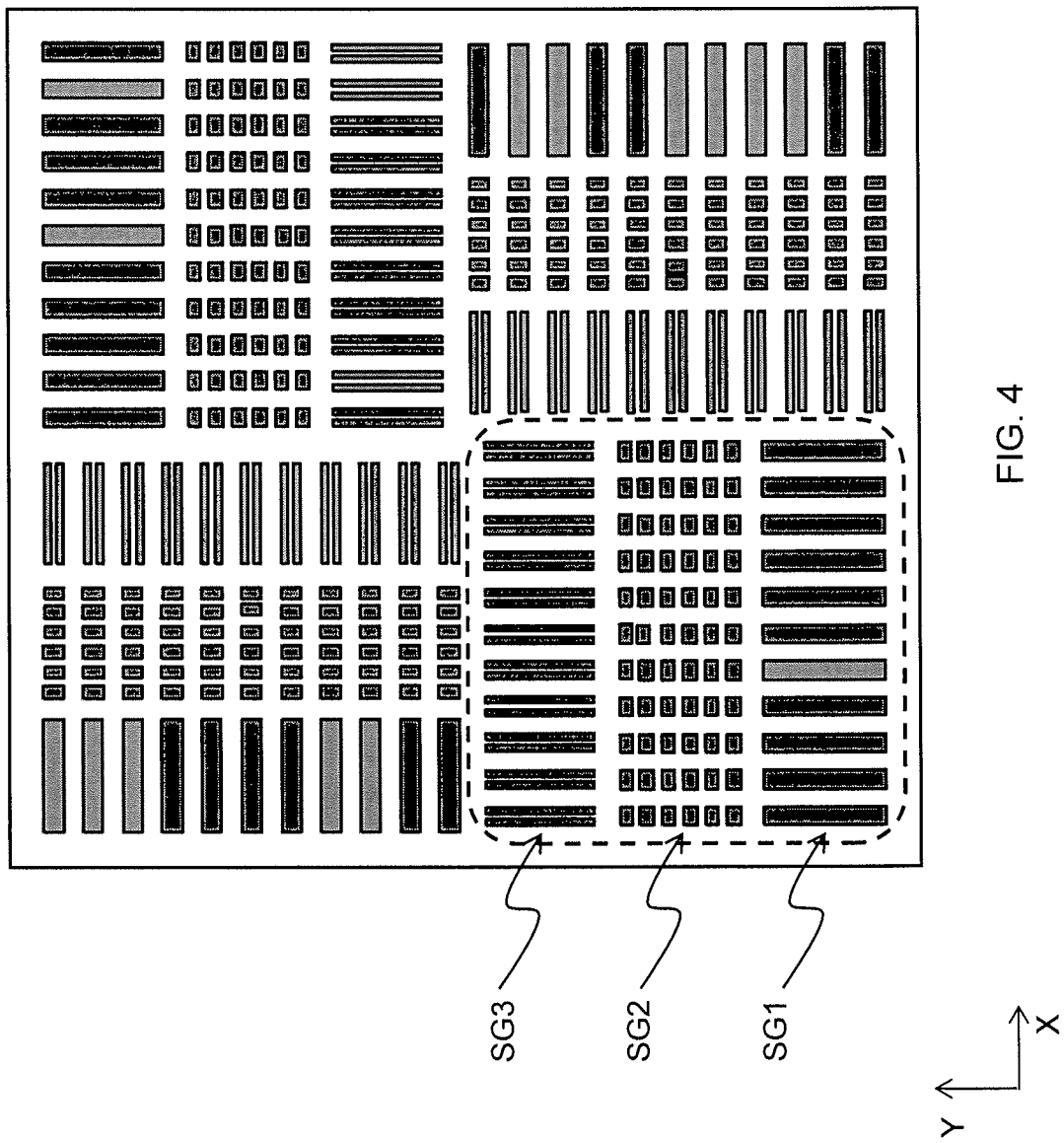
FIG. 4 is a view of overlay measurement patterns according to an embodiment of the present disclosure.

FIG. 4 shows a DBO measurement pattern in accordance with embodiments of the present disclosure. In FIG. 4, the DBO measurement patterns are non-uniform in the X direction and the Y direction. In some embodiments, one of the quadrant target areas (the lower-left area in FIG. 4) is divided in two or more segments in the Y direction.

In the first segment SG1, each of the patterns has a single line. In the second segment SG2, each of the patterns has two or more sub-patterns arranged in the Y direction. In the third segment SG3, each of the patterns has two or more sub-patterns arranged in the X direction. Within each segment, the sub-patterns are uniform in the Y direction, and non-uniform in the X direction, in some embodiments. In other embodiments, when the sub-patterns are a plurality of patterns arranged in the Y direction, the pitch of the sub-patterns can vary (non-uniform). Although FIG. 4 shows three segments, the number of segments can be two or more than three.

When the DBO measurement patterns of FIG. 4 are used as one of the lower layer pattern and the upper layer pattern, the other of the lower layer pattern and the upper layer pattern may be similar patterns to FIG. 4, the patterns with a constant pitch and a constant width, or may be one of the non-uniform patterns shown in FIGS. 3A-3D.

Figure 5:
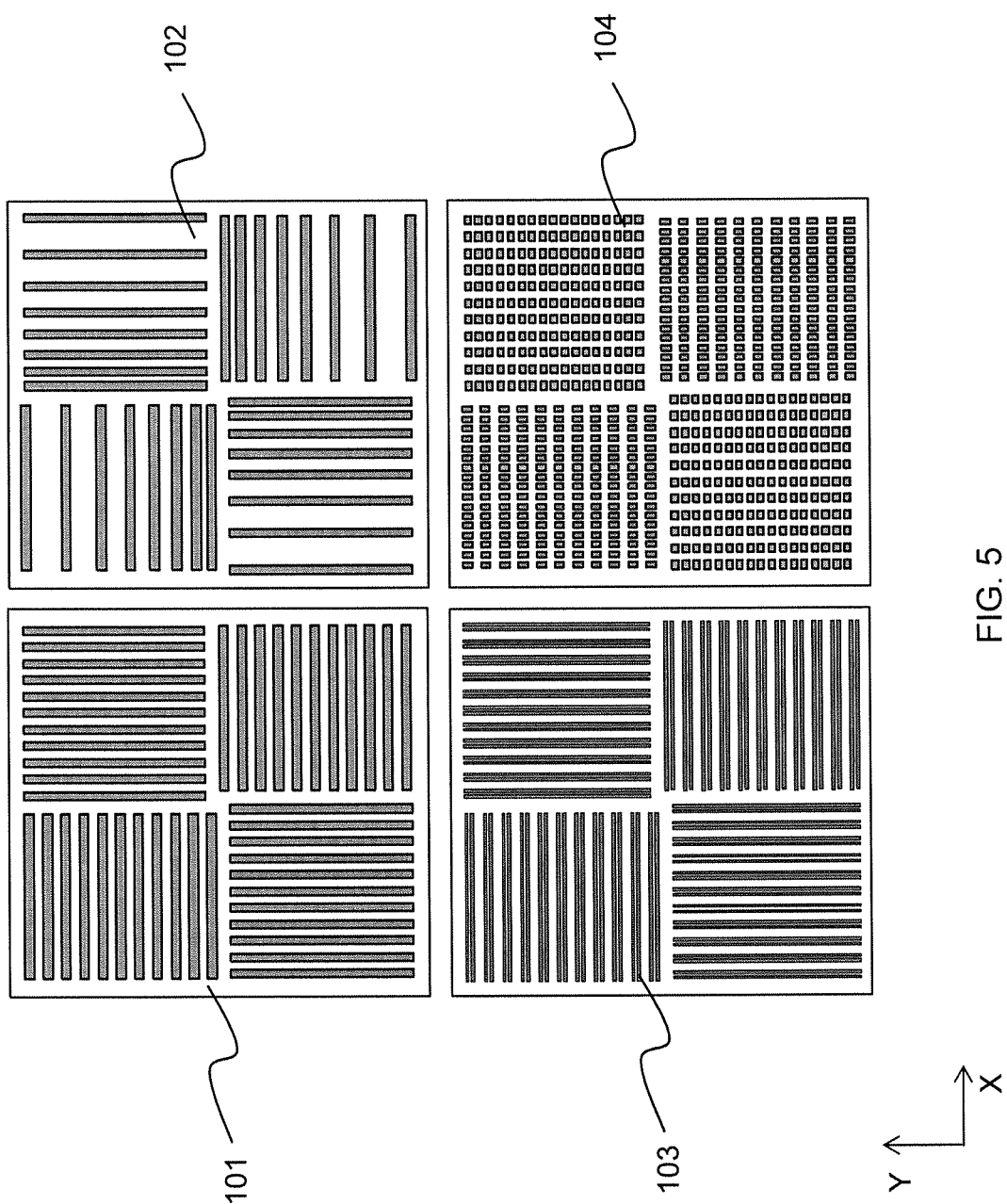
FIG. 5 is a view of overlay measurement patterns according to an embodiment of the present disclosure.

FIG. 5 shows a DBO measurement pattern in accordance with embodiments of the present disclosure. In FIG. 5, various sets of the DBO measurement patterns are clustered to be placed on a plurality of locations (e.g., four corners) of an exposure area.

In some embodiments, the cluster of the DBO measurement patterns includes a conventional DBO measurement pattern set 101 having uniform pitch and uniform width. The cluster of the DBO measurement patterns also includes the "non-uniform" DBO measurement pattern set 102 as set forth above.

Further, in some embodiments, other types of DBO measurement pattern sets are included in the cluster. For example, the DBO measurement pattern set 103 includes two or more thin line patterns instead of a line pattern similar to the patterns in the segment SG3 shown in FIG. 4, and the DBO measurement pattern set 104 includes a plurality of small patterns instead of a line pattern similar to the patterns in the segment SG2 shown in FIG. 4. In the DBO measurement pattern sets 103 and/or 104, at least one of the pattern pitch and the pattern width may vary. In the DBO measurement pattern sets 103 and/or 104, the counter part of the DBO measurement pattern set can be the conventional DBO measurement pattern set, and can be one of the DBO measurement pattern sets in accordance with the present embodiments.

In the forgoing embodiments, a DBO measurement structure for a semiconductor device manufacturing operation is explained. However, the DBO measurement structure of the present disclosure can be applied to a liquid crystal display (LCD) panel manufacturing operation, a micro electro mechanical system (MEMS) manufacturing operation and/or any other micro or nano structure fabrication operations, which include lithography operations.

The various embodiments or examples described herein offer several advantages over the existing art. For example, in the present disclosure, by combining non-uniform grating patterns (DBO measurement structures) combined with a specific calculation method, it is possible to eliminate adverse effects of the pattern asymmetry caused by the semiconductor manufacturing operations, and thus it is possible to reduce the overlay measurement errors caused by such a pattern asymmetry.

It will be understood that not all advantages have been necessarily discussed herein, no particular advantage is required for all embodiments or examples, and other embodiments or examples may offer different advantages.

In accordance with an aspect of the present disclosure, an overlay error measurement structure includes a lower-layer pattern disposed over a substrate, and an upper-layer pattern disposed over the lower-layer pattern and at least partially overlapping with the lower-layer pattern. The lower-layer pattern includes a plurality of first sub-patterns extending in a first direction and being arranged in a second direction crossing the first direction. The upper-layer pattern includes a plurality of second sub-patterns extending in the first direction and being arranged in the second direction. At least one of a pattern pitch and a pattern width of at least one of at least a part of the first sub-patterns and at least a part of the second sub-patterns varies along the second direction. In one or more of the foregoing or following embodiments, a pattern pitch of the first sub-patterns is constant, and a pattern pitch of the second sub-patterns varies along the second direction, and at least a part of the second sub-patterns has a different pattern pitch than the first sub-patterns. In one or more of the foregoing or following embodiments, a pattern pitch of the second sub-patterns is constant, and a pattern pitch of the first sub-patterns varies along the second direction, and at least a part of the first sub-patterns has a different pattern pitch than the second sub-patterns. In one or more of the foregoing or following embodiments, the first sub-patterns include line-and-space patterns having a constant line width, and the second sub-patterns include line-and-space patterns, and a line width of line patterns of the line-and-space patterns of the second sub-patterns varies along the second direction. In one or more of the foregoing or following embodiments, the second sub-patterns include line-and-space patterns having a constant line width, and the first sub-patterns include line-and-space patterns, and a line width of line patterns of the line-and-space patterns of the first sub-patterns varies along the second direction. In one or more of the foregoing or following embodiments, at least ones of the first sub-patterns and the second sub-patterns include a plurality of groups of line-and-space patterns, each of which includes line-and-space patterns arranged in the second direction, and which are arranged in the first direction. In one or more of the foregoing or following embodiments, a length of the line-and-space patterns of the plurality of groups varies between the plurality of groups. In one or more of the foregoing or following embodiments, a length of the line-and-space patterns of the plurality of groups is constant between the plurality of groups.

In accordance with another aspect of the present disclosure, an overlay error measurement structure includes a lower-layer pattern disposed over a substrate, and an upper-layer pattern disposed over the lower-layer pattern. The lower-layer pattern includes a first group of a plurality of first sub-patterns extending in a first direction and being arranged in a second direction crossing the first direction, and a second group of a plurality of first sub-patterns extending in the first direction and being arranged in the second direction. The upper-layer pattern includes a first group of a plurality of second sub-patterns extending in the first direction and being arranged in the second direction, and a second group of a plurality of second sub-patterns extending in the first direction and being arranged in the second direction. The first group of the upper-layer pattern at least partially overlaps the first group of the lower-layer pattern and is shifted in the second direction by an amount of D+OV with respect to the first group of the lower-layer pattern. The second group of the upper-layer pattern at least partially overlaps the second group of the lower-layer pattern and is shifted in the second direction by an amount of −D+OV with respect to the second group of the lower-layer pattern. D is a predetermined design value and OV is an overlay error between the lower-layer and the upper-layer along the second direction. At least one of a pattern pitch and a pattern width of at least one of at least a part of the first sub-patterns and at least a part of the second sub-patterns varies along the second direction. In one or more of the foregoing or following embodiments, a pattern pitch of the first sub-patterns is constant, and a pattern pitch of the second sub-patterns varies along the second direction, and at least a part of the second sub-patterns has a different pattern pitch than the first sub-patterns. In one or more of the foregoing or following embodiments, a pattern pitch of the second sub-patterns is constant, and a pattern pitch of the first sub-patterns varies along the second direction, and at least a part of the first sub-patterns has a different pattern pitch than the second sub-patterns. In one or more of the foregoing or following embodiments, the first sub-patterns include line-and-space patterns having a constant line width, and the second sub-patterns include line-and-space patterns, and a line width of line patterns of the line-and-space patterns of the second sub-patterns varies along the second direction. In one or more of the foregoing or following embodiments, the second sub-patterns include line-and-space patterns having a constant line width, and the first sub-patterns include line-and-space patterns, and a line width of line patterns of the line-and-space patterns of the first sub-patterns varies along the second direction. In one or more of the foregoing or following embodiments, a center of gravity of the first group of the upper-layer pattern is shifted in the second direction by an amount of D+OV with respect to a center of gravity of the first group of the lower-layer pattern, and a center of gravity of the second group of the upper-layer pattern is shifted in the second direction by an amount of −D+OV with respect to a center of gravity of the second group of the lower-layer pattern.

In accordance with another aspect of the present disclosure, in a method of measuring an overlay error, an upper-layer overlay measurement pattern is formed over a lower-layer overlay measurement pattern. Measurement light is applied to the upper-layer and lower-layer overlay measurement patterns. Diffraction patterns from the upper-layer and lower-layer overlay measurement patterns are obtained. A diffraction pattern image of the diffraction patterns with respect to a plurality of regions within the diffraction pattern image is obtained. The overlay error between the upper-layer overlay measurement pattern and the lower-layer overlay measurement pattern is obtained by using a plurality analyzed results. A pattern configuration of the upper-layer overlay measurement pattern is different from a pattern configuration of the lower-layer overlay measurement pattern, other than a relative location of the upper-layer overlay measurement pattern and the lower-layer overlay measurement pattern. In one or more of the foregoing or following embodiments, the lower-layer overlay measurement pattern includes a first group of a plurality of first sub-patterns extending in a first direction and being arranged in a second direction crossing the first direction, and a second group of a plurality of first sub-patterns extending in the first direction and being arranged in the second direction. The upper-layer overlay measurement pattern includes a first group of a plurality of second sub-patterns extending in the first direction and being arranged in the second direction, and a second group of a plurality of second sub-patterns extending in the first direction and being arranged in the second direction. The first group of the upper-layer overlay measurement pattern is shifted in the second direction by an amount of D1+OV1 with respect to the first group of the lower-layer pattern, where OV1 is an overlay error along the second direction and D1 is a predetermined design value. The second group of the upper-layer overlay measurement pattern is shifted in the second direction by an amount of −D1+OV1 with respect to the second group of the lower-layer pattern. In one or more of the foregoing or following embodiments, the diffraction patterns are obtained by an optical image sensor, and the diffraction pattern image is analyzed by a pixel-by-pixel basis. In one or more of the foregoing or following embodiments, a number of the plurality of regions is 50 or more per the diffraction pattern image. In one or more of the foregoing or following embodiments, the lower-layer overlay measurement pattern further includes a third group of a plurality of first sub-patterns extending in the second direction and being arranged in the first direction, and a fourth group of a plurality of first sub-patterns extending in the second direction and being arranged in the first direction. The upper-layer overlay measurement pattern further includes a third group of a plurality of second sub-patterns extending in the second direction and being arranged in the first direction, and a fourth group of a plurality of second sub-patterns extending in the second direction and being arranged in the first direction. The third group of the upper-layer overlay measurement pattern is shifted in the first direction by an amount of D2+OV2 with respect to the third group of the lower-layer pattern, where OV2 is an overlay error along the first direction and D2 is a predetermined design value. The fourth group of the upper-layer overlay measurement pattern is shifted in the first direction by an amount of −D2+OV2 with respect to the fourth group of the lower-layer pattern. In one or more of the foregoing or following embodiments, the obtained overlay error is free from an influence caused by asymmetric pattern profile of the lower-layer overlay measurement pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An overlay error measurement structure, comprising:
a lower-layer pattern disposed over a substrate; and
an upper-layer pattern disposed over the lower-layer pattern and at least partially overlapping with the lower-layer pattern, wherein:
the lower-layer pattern comprises a first plurality of first sub-patterns having a first length extending in a first direction and being arranged in an extent having a second length in a second direction crossing the first direction in a first portion of the lower-layer pattern and a second plurality of second sub-patterns having substantially the second length extending in the second direction and being arranged in an extent substantially having the first length in the first direction in a second portion of the lower-layer pattern adjacent to the first portion of the lower-layer pattern,
the upper-layer pattern comprises a third plurality of third sub-patterns having a third length extending in the first direction and being arranged in an extent having a fourth length in the second direction in a first portion of the upper-layer pattern and a fourth plurality of fourth sub-patterns having substantially the fourth length in the second direction and being arranged in an extent having substantially the third length extending in the first direction in a second portion of the upper-layer pattern adjacent to the first portion of the upper-layer pattern, and
a pattern pitch varies along the second direction between each two neighboring sub-patterns within at least one of at least a part of the first plurality of first sub-patterns and at least a part of the third plurality of third sub-patterns and a pattern pitch varies along the first direction between each two neighboring sub-patterns within at least one of at least a part of the second plurality of second sub-patterns and at least a part of the fourth plurality of fourth sub-patterns.

2. The overlay error measurement structure of claim 1, wherein:
a pattern pitch of the first plurality of first sub-patterns is constant, and
a pattern pitch of the third plurality of third sub-patterns varies along the second direction, and at least a part of the third plurality of third sub-patterns has a different pattern pitch than the first plurality of first sub-patterns.

3. The overlay error measurement structure of claim 1, wherein:
a pattern pitch of the second plurality of second sub-patterns is constant, and
a pattern pitch of the first plurality of first sub-patterns varies along the second direction, and at least a part of the first plurality of first sub-patterns has a different pattern pitch than the second plurality of second sub-patterns.

4. The overlay error measurement structure of claim 1, wherein:
the first plurality of first sub-patterns include line-and-space patterns having a constant line width, and
the second plurality of second sub-patterns include line-and-space patterns, and a line width of line patterns of the line-and-space patterns of the second plurality of second sub-patterns varies along the first direction.

5. The overlay error measurement structure of claim 1, wherein:
the second plurality of second sub-patterns include line-and-space patterns having a constant line width, and
the first plurality of first sub-patterns include line-and-space patterns, and a line width of line patterns of the line-and-space patterns of the first plurality of first sub-patterns varies along the second direction.

6. The overlay error measurement structure of claim 1, wherein:
at least one of the first plurality of first sub-patterns and the second plurality of second sub-patterns include two or more line-and-space patterns, each one of the two or more line-and-space patterns is arranged in the second direction for the first plurality of first sub-patterns, and is arranged in the first direction for the second plurality of second sub-patterns.

7. The overlay error measurement structure of claim 6, wherein a length of the line-and-space patterns of the two or more line-and-space patterns varies between the two or more line-and-space patterns.

8. The overlay error measurement structure of claim 6, wherein a length of the line-and-space patterns of the two or more line-and-space patterns is a same length for the two or more line-and-space patterns.

9. The overlay error measurement structure of claim 1, wherein a pattern width within at least one of at least a part of the first plurality of first sub-patterns and at least a part of the second plurality of second sub-patterns is a constant.

10. An overlay error measurement structure, comprising:
a lower-layer pattern disposed over a substrate; and
an upper-layer pattern disposed over the lower-layer pattern and at least partially overlapping with the lower-layer pattern, wherein:
the lower-layer pattern comprises first lower sub-patterns having a first length extending in a first direction and being arranged in a second length in a second direction crossing the first direction in a first portion of the lower-layer pattern and second lower sub-patterns having substantially the second length extending in the second direction and being arranged in substantially the first length in the first direction in a second portion of the lower-layer pattern adjacent to the first portion of the lower-layer pattern,
the upper-layer pattern comprises third upper sub-patterns having a third length extending in the first direction and being arranged in a fourth length in the second direction in a first portion of the upper-layer pattern and fourth upper sub-patterns having substantially the fourth length extending in the second direction and being arranged in substantially the third length in the first direction in a second portion of the upper-layer pattern adjacent to the first portion of the lower-layer pattern, and
a pattern pitch varies along the first direction between each two neighboring sub-patterns of at least one of a part of the second lower sub-patterns and at least a part of the fourth upper sub-patterns and a pattern pitch varies along the second direction between each two neighboring sub-patterns of at least one of a part of the first lower sub-patterns and at least a part of the third upper sub-patterns and a pattern width of one of at least a part of the first lower sub-patterns and at least a part of the third upper sub-patterns is a constant along the second direction.

11. The overlay error measurement structure of claim 10, wherein the pattern pitch of the first lower sub-patterns and the pattern width of the second lower sub-patterns are constants.

12. The overlay error measurement structure of claim 10, wherein the pattern pitch of the third upper sub-patterns and the pattern width of the fourth upper sub-patterns are constants.

13. The overlay error measurement structure of claim 10, wherein the first lower sub-patterns and the second lower sub-patterns are disposed adjacent to each other along the second direction, and wherein the third upper sub-patterns and the fourth upper sub-patterns are disposed adjacent to each other along the second direction.

14. An overlay error measurement structure, comprising:
a lower-layer pattern disposed over a substrate; and
an upper-layer pattern disposed over the lower-layer pattern and at least partially overlapping with the lower-layer pattern, wherein:
the lower-layer pattern comprises a first plurality of first sub-patterns having a first length extending in a first direction and being arranged in an extent having a second length in a second direction crossing the first direction in a first portion of the lower-layer pattern and a second plurality of second sub-patterns having substantially the second length extending in the second direction and being arranged in an extent substantially having the first length in the first direction in a second portion of the lower-layer pattern adjacent to the first portion of the lower-layer pattern,
the upper-layer pattern comprises a third plurality of third sub-patterns having a third length extending in the first direction and being arranged in an extent having a fourth length in the second direction in a first portion of the upper-layer pattern and a fourth plurality of fourth sub-patterns having substantially the fourth length in the second direction and being arranged in an extent having substantially the third length extending in the first direction in a second portion of the upper-layer pattern adjacent to the first portion of the upper-layer pattern,
a pattern pitch varies along the second direction between each two neighboring sub-patterns within at least one of at least a part of the first plurality of first sub-patterns and at least a part of the third plurality of third sub-patterns and a pattern pitch varies along the first direction between each two neighboring sub-patterns within at least one of at least a part of the second plurality of second sub-patterns and at least a part of the fourth plurality of fourth sub-patterns;
the lower-layer pattern further comprises a fifth plurality of first sub-patterns extending in the first direction and being arranged in the second direction and being substantially diagonally symmetric with the first plurality of first sub-patterns in a third portion of the lower-layer pattern; and
the upper-layer pattern further comprises a sixth plurality of third sub-patterns extending in the first direction and being arranged in the second direction and being substantially diagonally symmetric with the third plurality of third sub-patterns in a third portion of the upper-layer pattern, wherein:
the third plurality of third sub-patterns of the upper-layer pattern is shifted in the second direction by an amount of D+OV with respect to the first plurality of first sub-patterns of the lower-layer pattern,
the sixth plurality of third sub-patterns of the upper-layer pattern is shifted in the second direction by an amount of −D+OV with respect to the fifth plurality of first sub-patterns of the lower-layer pattern, and
D is a predetermined design value and OV is an overlay error between the lower-layer pattern and the upper-layer pattern along the second direction.

15. The overlay error measurement structure of claim 14, wherein the second sub-patterns are substantially perpendicular to the first sub-patterns and the fourth sub-patterns are substantially perpendicular to the third sub-patterns.

16. The overlay error measurement structure of claim 14, wherein:
a center of gravity of the third plurality of third sub-patterns of the upper-layer pattern is shifted in the second direction by an amount of D+OV with respect to a center of gravity of the first plurality of first sub-patterns of the lower-layer pattern, and
a center of gravity of the sixth plurality of third sub-patterns of the upper-layer pattern is shifted in the second direction by an amount of −D+OV with respect to a center of gravity of the fifth plurality of first sub-patterns of the lower-layer pattern.

17. The overlay error measurement structure of claim 14, wherein a pattern width within at least one of at least a part of the first plurality of first sub-patterns, at least a part of the second plurality of second sub-patterns, and at least a part of the fifth plurality of first sub-patterns is a constant.

18. The overlay error measurement structure of claim 14, wherein a pattern pitch varies along the second direction between each two neighboring sub-patterns within at least one of at least a part of the fifth plurality of first sub-patterns and at least a part of the sixth plurality of third sub-patterns.

19. The overlay error measurement structure of claim 14, wherein:
a pattern pitch of the first plurality of first sub-patterns is constant, and
a pattern pitch of the third plurality of third sub-patterns varies along the second direction, and at least a part of the third plurality of third sub-patterns has a different pattern pitch than the first plurality of first sub-patterns.

20. The overlay error measurement structure of claim 14, wherein the first plurality of first sub-patterns and the second plurality of second sub-patterns are disposed adjacent to each other along the second direction, and wherein the third plurality of third sub-patterns and the fourth plurality of fourth sub-patterns are disposed adjacent to each other along the second direction.

* * * * *